US012020968B2

United States Patent
Kawawa

(10) Patent No.: US 12,020,968 B2
(45) Date of Patent: Jun. 25, 2024

(54) METHOD FOR ADJUSTING CONTACT POSITION OF LIFT PINS, METHOD FOR DETECTING CONTACT POSITION OF LIFT PINS, AND SUBSTRATE PLACEMENT MECHANISM

(71) Applicant: TOKYO ELECTRON LIMITED, Tokyo (JP)

(72) Inventor: Takahiro Kawawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 361 days.

(21) Appl. No.: 17/502,490

(22) Filed: Oct. 15, 2021

(65) Prior Publication Data
US 2022/0130702 A1    Apr. 28, 2022

(30) Foreign Application Priority Data
Oct. 22, 2020 (JP) .................................. 2020-177432

(51) Int. Cl.
| | |
|---|---|
| *H01L 21/68* | (2006.01) |
| *C23C 14/34* | (2006.01) |
| *C23C 14/50* | (2006.01) |
| *G01B 7/00* | (2006.01) |
| *H01J 37/32* | (2006.01) |

(Continued)

(52) U.S. Cl.
CPC ............. *H01L 21/68* (2013.01); *C23C 14/34* (2013.01); *C23C 14/50* (2013.01); *G01B 7/003* (2013.01); *H01J 37/32715* (2013.01); *H01L 21/6833* (2013.01); *H01L 21/68742* (2013.01); *G01L 3/00* (2013.01); *H01J 2237/2007* (2013.01);

(Continued)

(58) Field of Classification Search
CPC ................ H01L 21/68; H01L 21/6833; H01L 21/68742; H01L 21/683; H01L 2237/2007; H01L 2237/20235; H01L 2237/332; C23C 14/34; C23C 14/50; H01J 37/32715; H01J 2237/2007; H01J 2237/20235; H01J 2237/332
USPC ...................................................... 204/298.15
See application file for complete search history.

(56) References Cited

U.S. PATENT DOCUMENTS

2008/0089001 A1* 4/2008 Parkhe ................ H01L 21/6831
279/128

FOREIGN PATENT DOCUMENTS

| JP | 2010-278271 | * 12/2010 |
|---|---|---|
| JP | 2017-050534 A | 3/2017 |

OTHER PUBLICATIONS

Machine Translation of JP 2010-278271 (Year: 2010).*

* cited by examiner

*Primary Examiner* — Rodney G McDonald
(74) *Attorney, Agent, or Firm* — Fenwick & West LLP

(57) ABSTRACT

A method for adjusting a contact position of lift pins in a substrate placement mechanism is provided. The substrate placement mechanism includes a substrate placement table and a substrate lifting mechanism having lift pins and a driving mechanism, wherein the contact position of the lift pins is a height position where tip ends of the lift pins get in contact with the substrate. The method comprises creating torque waveforms, for a plurality of voltages, indicating temporal changes of a torque of the motor while moving the tip ends of the lift; obtaining from the plurality of torque waveforms a contact point when the lift pins get in contact with the substrate and calculating the contact position from the contact point and a speed of the motor; determining (Continued)

whether the contact position is within an appropriate range; and automatically adjusting the contact position when the contact position is not within the appropriate range.

15 Claims, 13 Drawing Sheets

(51) Int. Cl.
*H01L 21/683* (2006.01)
*H01L 21/687* (2006.01)
*G01L 3/00* (2006.01)
(52) U.S. Cl.
CPC ................ *H01J 2237/20235* (2013.01); *H01J 2237/332* (2013.01)

METHOD FOR ADJUSTING CONTACT POSITION OF LIFT PINS, METHOD FOR DETECTING CONTACT POSITION OF LIFT PINS, AND SUBSTRATE PLACEMENT MECHANISM

CROSS-REFERENCE TO RELATED APPLICATIONS

This application claims priority to and the benefit of Japanese Patent Application No. 2020-177432, filed on Oct. 22, 2020, the disclosure of which is incorporated herein by reference in its entirety.

TECHNICAL FIELD

The present disclosure relates to a method for adjusting a contact position of lift pins, a method for detecting a contact position of lift pins, and a substrate placement mechanism.

BACKGROUND

In a substrate processing apparatus for processing a substrate such as a semiconductor wafer or the like, a substrate placement table on which a substrate is placed is provided with a plurality of lift pins that can protrude beyond and retract below a substrate placement surface to transfer the substrate with respect to the substrate placement table.

Japanese Patent Application Publication No. 2017-50534 discloses a substrate processing apparatus including a substrate lifting device for raising and lowering a substrate by raising and lowering lift pins using a servomotor. A controller monitors an output value from a motor driver of the servomotor, detects a height position at which tip ends of the lift pins get in contact with a bottom surface of the substrate placed on the substrate placement surface, and adjusts the height position of the lift pins based on the detected height position.

SUMMARY

The present disclosure provides a technique capable of automatically adjusting contact position of lift pins with respect to a substrate placed on a substrate placement table with high accuracy.

To this end, the present disclosure provides a method for adjusting a contact position of lift pins in a substrate placement mechanism, wherein the substrate placement mechanism includes: a substrate placement table having an electrostatic chuck configured to electrostatically attract a substrate and having a substrate placed thereon; and a substrate lifting mechanism including lift pins protrudable beyond and retractable below a substrate placement surface of the substrate placement table and a driving mechanism having a motor configured to raise and lower the lift pins, and wherein the contact position of the lift pins refers to a height position at which tip ends of the lift pins get in contact with the substrate, the method comprising: creating torque waveforms, for a plurality of voltages, that indicate temporal changes of a torque of the motor while moving the tip ends of the lift pins from a lower end position below the substrate placement surface and an upper end position above the substrate placement surface in a state where the substrate is placed on the substrate placement table and chucked by application of a voltage to an electrode of the electrostatic chuck; obtaining from the plurality of torque waveforms a contact point that is a timing at which the lift pins get in contact with the substrate and calculating the contact position from the contact point and a speed of the motor; determining whether or not the contact position is within an appropriate range; and automatically adjusting the contact position when it is determined that the contact position is not within the appropriate range.

BRIEF DESCRIPTION OF THE DRAWINGS

The objects and features of the present disclosure will become apparent from the following description of embodiments, given in conjunction with the accompanying drawings, in which:

FIGS. 6A and 6B show torque waveforms of the motor in the case where the lift pins are made of Ti and Al2O3, wherein FIG. 6A shows a case where a voltage of 1300V is applied to chuck the substrate, and FIG. 6B shows a case where no voltage is applied;

DETAILED DESCRIPTION

Hereinafter, embodiments will be described in detail with reference to the accompanying drawings.

\<Substrate Processing Apparatus\>

Figure 1:
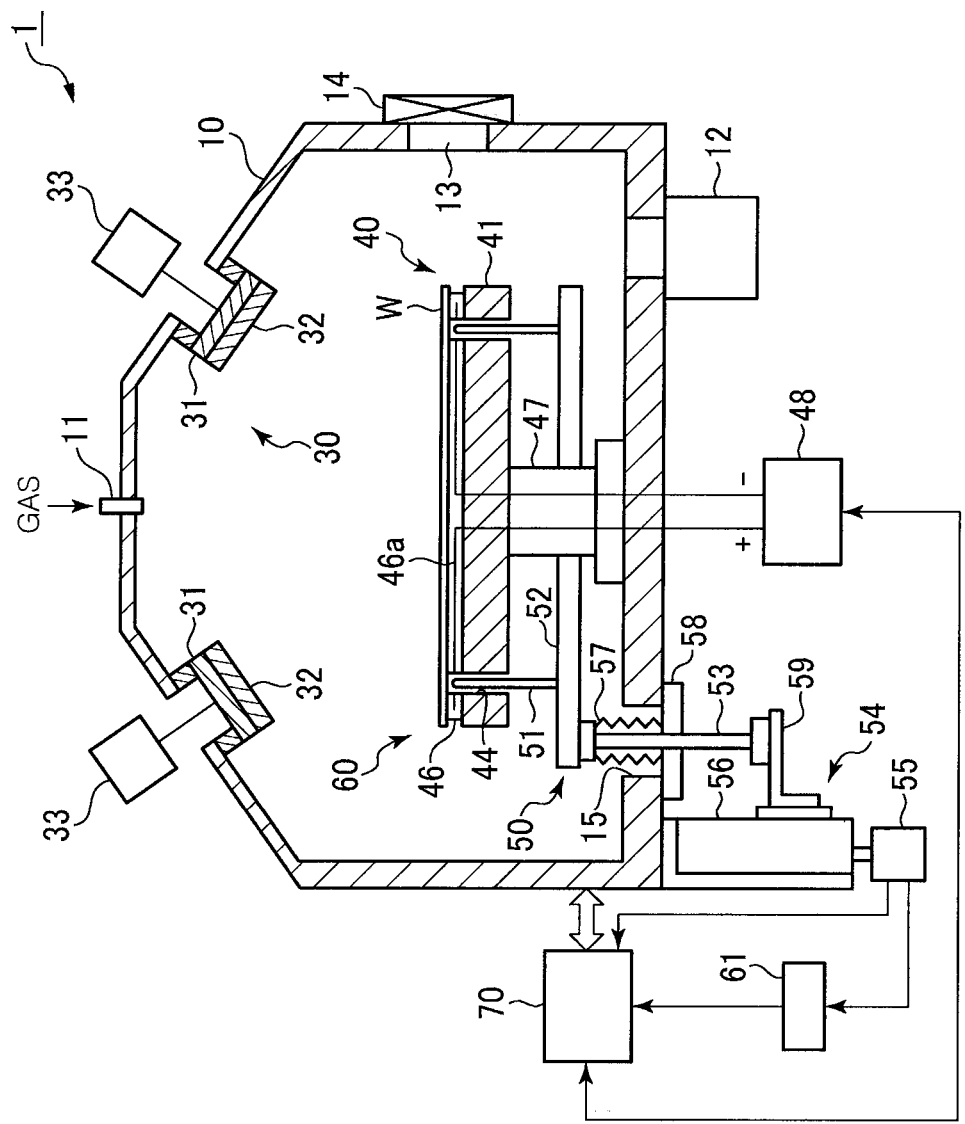
FIG. 1 is a cross-sectional view showing an example of a substrate processing apparatus including a substrate placement mechanism that can perform a lift pin contact position adjusting method according to an embodiment.

FIG. 1 is a cross-sectional view showing an example of a substrate processing apparatus including a substrate placement mechanism that can perform a lift pin contact position adjusting method according to an embodiment.

In the present embodiment, a case where the substrate processing apparatus is a film forming apparatus for forming a film on a substrate by sputtering will be described as an example. The substrate may be, e.g., a semiconductor wafer, but is not limited thereto.

As shown in FIG. 1, a substrate processing apparatus 1 includes a processing chamber 10, a sputter particle emitter 30, a substrate placement table 40, a substrate lifting mechanism 50, and a controller 70. The substrate placement table 40 and the substrate lifting mechanism 50 constitute a substrate placement mechanism 60.

The processing chamber 10 accommodates the substrate W and is configured such that the inside thereof can be maintained in a vacuum state. An upper portion of the processing chamber 10 has inclined side surfaces. A gas inlet port 11 is disposed at a top portion of the processing chamber 10. A gas supply line (not shown) is connected to the gas inlet port 11, and a gas for sputtering film formation (e.g., a noble gas such as argon, krypton, neon, or a nitrogen gas) is supplied from the gas supply line. Further, an exhaust mechanism 12 having a vacuum pump capable of reducing the pressure in the processing chamber 10 to a vacuum level is connected to a bottom portion of the processing chamber 10. Further, a loading/unloading port 13 for loading/unloading the substrate is formed on a sidewall of the processing chamber 10. The loading/unloading port 13 is opened and closed by a gate valve 14. By opening the gate valve 14, the processing chamber 10 communicates with a vacuum transfer chamber (not shown) adjacent thereto, and the substrate W is loaded/unloaded by a transfer device (not shown) in the vacuum transfer chamber.

The sputter particle emitter 30 includes a plurality of (two in FIG. 1) target holders 31, a plurality of targets 32 respectively held by the target holders 31, and a plurality of power supplies 33 for applying voltage to the target holders 31.

The target holders 31 are made of a conductive material and attached to the inclined side surfaces of the top portion of the processing chamber 10 via insulating members. The target holders 31 respectively hold the targets 32, such that the targets 32 are disposed diagonally upward with respect to the substrate W held by the substrate placement mechanism 60 to be described later.

The targets 32 are made of a material containing a constituent element of a film to be formed. For example, in the case of forming a magnetic film (a film containing a ferromagnetic material such as Ni, Fe, Co, or the like), it is possible to use, e.g., CoFe, FeNi, and NiFeCo as a material of the targets 32.

The power supplies 33 are electrically connected to the target holders 31, respectively. By applying voltage (e.g., a DC voltage) from the power supplies 33 to the target holders 31, respectively, a sputtering gas is dissociated around the targets 32. Then, ions in the dissociated sputtering gas collide with the targets 32, and sputter particles, which are particles of the constituent material of the targets 32, are emitted from the targets 32.

Alternatively, there may be one target holder 31 and one target 32.

The substrate placement table 40 is used for placing the substrate W thereon, and an upper surface of the substrate placement table 40 serves as a placement surface on which the substrate is placed. The substrate placement table 40 is formed in a plate shape having a diameter slightly greater than that of the substrate W, and includes a main body 41 made of a metal material such as aluminum, and an electrostatic chuck 46 disposed on the main body 41 and configured to electrostatically attract the substrate W. The electrostatic chuck 46 has an upper surface serving as a placement surface, and an electrode 46a is embedded in a dielectric. The substrate W placed on the placement surface is attracted by an electrostatic force generated by applying a DC voltage from the DC power supply 48 to the electrode 46a. The main body 41 is supported by a cylindrical support 47 extending downward from the center of a bottom surface of the main body 41. The substrate placement table 40 is configured to be heated or cooled by a temperature control mechanism (not shown). For example, when a film to be formed is a magnetic film (e.g., a film containing a ferromagnetic material such as Ni, Fe, Co or the like) used for a tunneling magneto resistance (TMR) element, the substrate placement table 40 is cooled to an extremely low temperature of 100K or lower. Further, the substrate placement table 40 may be rotatable by a rotation mechanism (not shown).

The substrate lifting mechanism 50 includes a plurality of lift pins 51 for raising and lowering the substrate, a support plate 52 for supporting the lift pins, a lifting rod 53 for raising and lowering the support plate 52, a driving mechanism 54, and a bellows 57.

The lift pins 51 are inserted into holes 44 formed in the substrate placement table 40, and are configured to be protrudable beyond and retractable below the substrate placement surface. The number and arrangement of the lift pins 51 are appropriately set depending on the shape and size of the substrate W. Further, the lift pins 51 may be made of a conductor such as Ti or an insulator such as $Al_2O_3$. The support plate 52 is disposed below the substrate placement table 40, and is configured to be raised and lowered together with the lift pins 51 while supporting the lift pins 51. One end of the lifting rod 53 extends downward while being fixed to a bottom surface of the support plate 52, and reaches the outside of the processing chamber 10 through a through-hole 15 formed in a bottom wall of the processing chamber 10.

The driving mechanism 54 includes a motor 55 and a ball screw mechanism 56. The driving mechanism 54 rotates a ball screw (not shown) of the ball screw mechanism 56 using the motor 55 and vertically moves a movable member 59 guided by a guide member (not shown). A lower end of the lifting rod 53 is attached to the movable member 59. By rotating the motor 55, the lifting rod 53 is raised and lowered via the ball screw mechanism 56 and the movable member 59. Accordingly, the lift pins 51 are raised and lowered together with the support plate 52. The motor 55 may be a servo motor or a stepping motor.

Figure 2A:
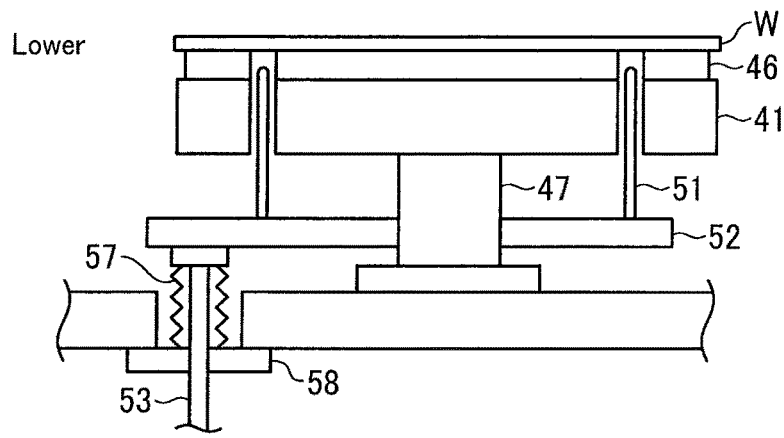
FIGS. 2A to 2C are cross-sectional views for explaining a lower end position (Lower), an upper end position (Upper), and a contact position (Contact) of tip ends of lift pins.
Figure 2B:
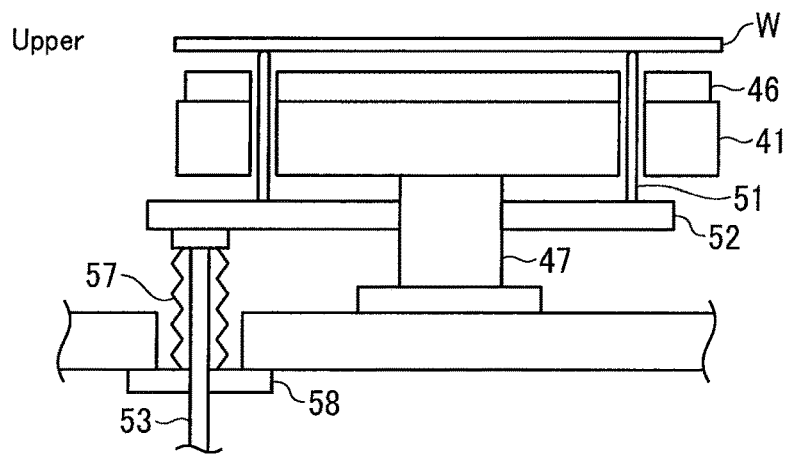
Figure 2C:
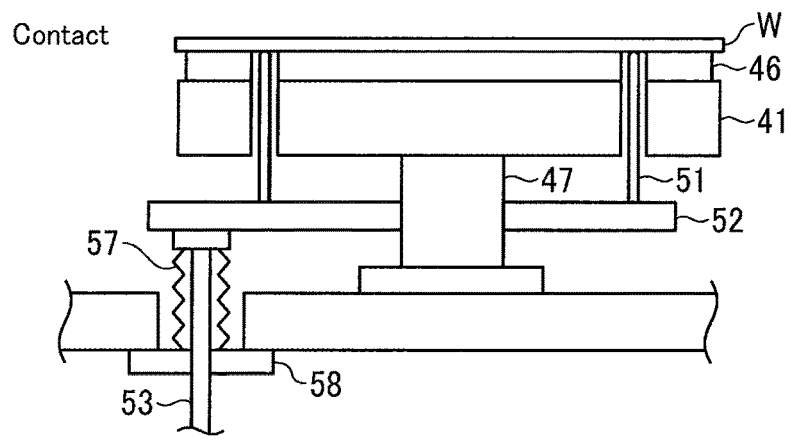

The tip ends of the lift pins 51 are moved between the lower end position (Lower) and the upper end position (Upper), wherein the lower end position (Lower) is lower than the placement surface shown in FIG. 2A and recessed in the holes 44 of the substrate placement table 40, and the upper end position (Upper) is higher than the substrate placement surface of the substrate placement table 40 shown in FIG. 2B. Further, the position shown in FIG. 2C where the tip ends of the lift pins 51 get in contact with the substrate W placed on the placement surface of the substrate placement table 40 is the contact position (Contact). The lower end position of the tip ends of the lift pins 51 is set as the origin, and the contact position is defined as a height position from the lower end position (i.e., the origin). The contact position can be adjusted by adjusting the lower end position (i.e., the origin).

The portion of the outer surface of the bottom wall of the processing chamber 10, which corresponds to the through-hole 15, is shielded by a shielding plate 58 having a hole through which the lifting rod 53 is inserted, and the bellows 57 is disposed around the lifting rod 53 between the support plate 52 and the shielding plate 58. The vacuum atmosphere in the processing chamber 10 and the atmospheric atmosphere outside the processing chamber 10 are shielded by the bellows 57. Further, the bellows 57 functions as a spring, and an upward spring force applies on the lift pins 51.

The torque of the motor 55 is measured by a torque measuring device (not shown) and outputted as analog information (0V to 10V). The output value is processed by a PLC 61 and sent to the controller 70.

Figure 3:
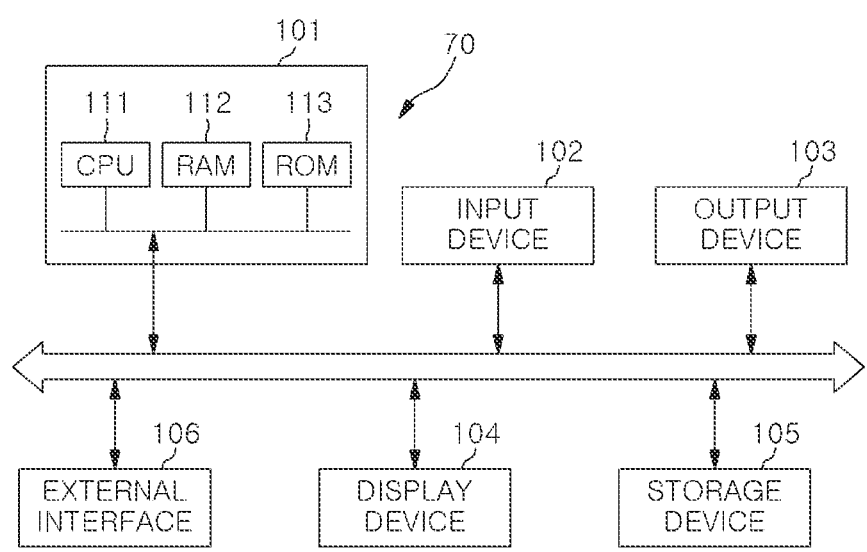
FIG. 3 is a block diagram showing an example of a hardware configuration of a controller in the substrate processing apparatus according to an embodiment.

The controller 70 controls individual components of the substrate processing apparatus 1, such as the power supply 33, the DC power supply 48, the exhaust mechanism 12, the driving mechanism 54, and the like. A part of the controller 70 also functions as a controller of the substrate placement mechanism 60. The controller 70 is typically a computer. FIG. 3 shows an example of a hardware configuration of the controller 70. The controller 70 includes a main controller 101, an input device 102 such as a keyboard, a mouse, or the like, an output device 103 such as a printer or the like, a display device 104, a storage device 105, an external interface 106, and a bus 107 that connects the above components. The main controller 101 has a central processing unit (CPU) 111, a RAM 112, and a ROM 113. The storage device 105 is configured to store and read information required for control. The storage device 105 has a computer-readable storage medium that stores a processing recipe for processing the substrate W or the like.

In the controller 70, the CPU 111 executes a program stored in the ROM 113 or the storage medium of the storage device 105 while using the RAM 112 as a work area to perform various operations such as processing of the substrate W and the like. The present embodiment is particularly characterized in that the contact position of the lift pins is detected and adjusted.

Figure 4:
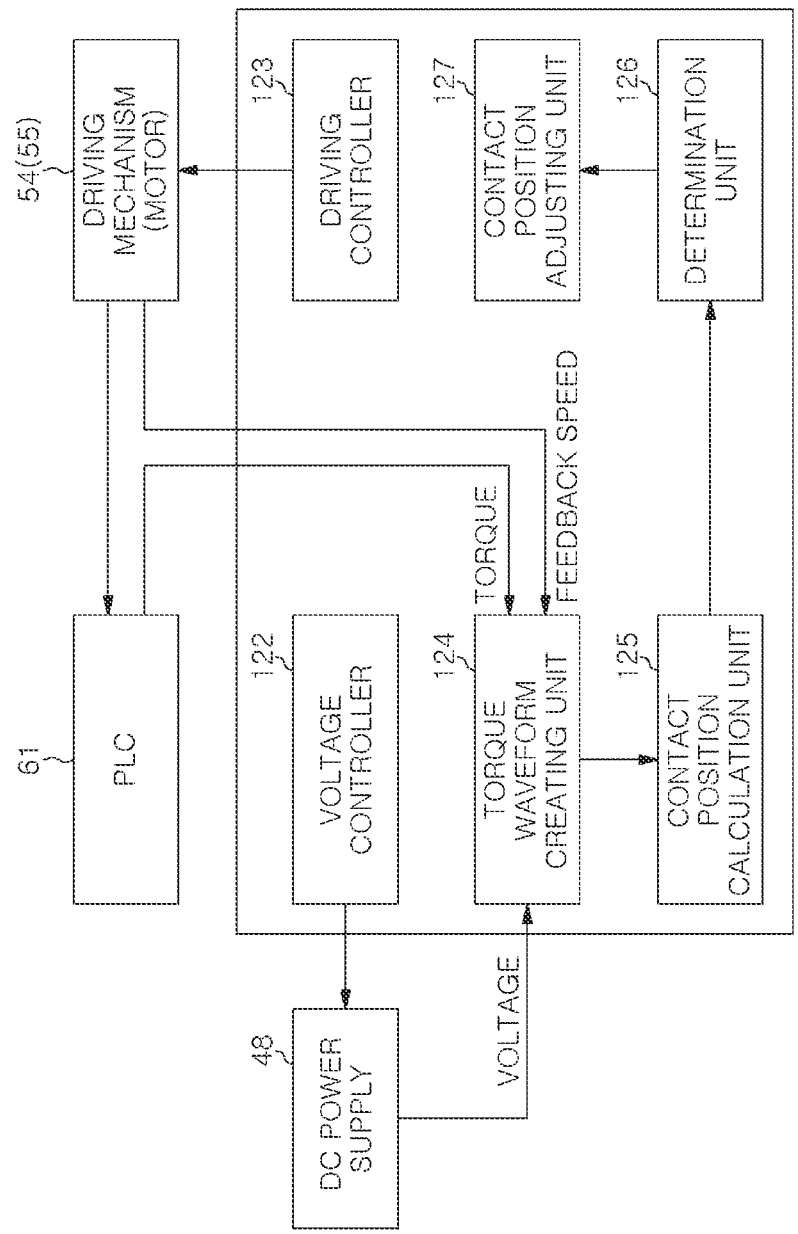
FIG. 4 is a functional block diagram showing a substrate placement mechanism controller.

FIG. 4 is a functional block diagram showing a substrate placement mechanism controller 121 in the controller 70 that functions as a part of the substrate placement mechanism 60 and adjusts the contact position of the lift pins. The substrate placement mechanism controller 121 includes a voltage controller 122, a driving controller 123, a torque waveform creating unit 124, a contact position calculation unit 125, a determination unit 126, and a contact position adjusting unit 127.

The voltage controller 122 controls the voltage of the DC power supply 48. The driving controller 123 controls the movement of the lift pins 51 by the driving mechanism 54 (the motor 55). The torque waveform creating unit 124 has a function of creating a plurality of waveforms (torque waveforms) for a plurality of voltages, the waveforms indicating temporal changes of the torque of the motor 55 at while moving the tip ends of the lift pins 51 from the lower end position to the upper end position by the driving mechanism 54 in a state where the substrate W is chucked. The contact position calculation unit 125 calculates the contact position of the lift pins 51 from the torque waveforms created for the plurality of voltages by the torque waveform creating unit 124. The determination unit 126 determines whether or not the contact position of the lift pins 51 calculated by the contact position calculation unit 125 is appropriate. When the determination unit 126 determines that the contact position of the lift pins 51 is not appropriate, the contact position adjusting unit 127 issues to the driving mechanism 54 a command for adjusting the contact position of the lift pins 51 to an appropriate range.

In the substrate processing apparatus 1 configured as described above, the gate valve 14 is opened, and the substrate W is loaded into the processing chamber 10 by the transfer device in the vacuum transfer chamber (both not shown). At this time, the tip ends of the lift pins 51 are located at the upper end position (Upper) protruding upward from the placement surface, and the substrate W held by the transfer device is delivered onto the lift pins 51. Then, by lowering the lift pins 51, the substrate W is placed on the placement surface of the substrate placement table 40. Next, the transfer device retreats from the processing chamber 10, and the gate valve 14 is closed. Thereafter, by applying a desired chuck voltage from the DC power supply 48 to the electrode 46a of the electrostatic chuck 46, the substrate W is electrostatically attracted.

Next, a sputtering gas is introduced into the processing chamber 10 from the gas inlet port 11, and the pressure in the processing chamber 10 is controlled to a predetermined vacuum pressure by the exhaust mechanism 12 to perform sputtering film formation. The sputtering film formation is performed by applying a voltage from the power supply 33 to the target holders 31 and causing ions in the sputtering gas dissociated around the targets 32 to collide with the targets 32. In other words, when the ions collide with the targets 32, the sputter particles are released and obliquely incident on the surface of the substrate W to be deposited on the substrate W. At this time, more uniform film formation can be performed by performing the sputtering film formation while rotating the substrate placement table 40 using the rotation mechanism.

Upon completion of the film formation, the sputtering gas is introduced as a purge gas from the gas inlet port 11 into the processing chamber 10 to purge the inside of the processing chamber 10. Then, the chuck voltage of the electrostatic chuck 46 is turned off, and electrostatic charges are removed by means of separation charging (forced charging). Thereafter, the tip ends of the lift pins 51 are raised from the lower end position (Lower) to the upper end position (Upper) to lift the substrate W. Next, the gate valve 14 is opened, and the substrate W on the lift pins 51 is received by the transfer device in the vacuum transfer chamber and unloaded from the processing chamber 10.

<Lift Pin Contact Position Adjusting Method>

Next, a lift pin contact position adjusting method in the above-described substrate processing apparatus will be described.

Generally, in the substrate placement table having the electrostatic chuck, when the substrate is unloaded, the substrate may not be separated from the electrostatic chuck due to abnormal charging even if the chuck voltage of the electrostatic chuck is turned off and separation charging is performed. If the lift pins get in contact with the substrate without being decelerated in a state where abnormal charging has occurred, the substrate may be cracked, displaced, or bounced. Therefore, the motor is controlled such that the Z-axis driving speed of the lift pins is decelerated at the contact position.

Further, when the substrate processing apparatus performs the sputtering film formation described in the present embodiment, the contact position is changed due to the expansion/contraction of the lift pins during the processing in which the temperature of the substrate placement table ranges from a extremely low temperature of 100K (−173° C.) to a high temperature of about 400° C. The contact position is also changed due to differences in devices or device errors during maintenance. Therefore, at the time of changing a temperature of the substrate placement table, introducing a new apparatus, maintaining the apparatus, or the like, it is determined whether or not the contact position is appropriate by using a jig for measuring a height, and adjustment (teaching) is performed when the contact position is not appropriate.

Since, however, the above teaching is performed in an atmospheric state and a room temperature state, it is difficult to predict the expansion or contraction of the lift pins, especially in the case of processing under extremely low-temperature or high-temperature, and it is also difficult to obtain the exact contact position. Therefore, it is not possible to effectively prevent the lift pins from getting in contact with the substrate without decelerating the lift pins at the contact position, and there is still a possibility that the substrate is cracked, displaced, or bounced.

Further, in Japanese Patent Application Publication No. 2017-50534, the controller monitors the output value from the motor driver of the servomotor (the accumulated pulse that is the difference between a command pulse and a return pulse in the servomotor, or the torque value in the servomotor). Then, the height position at which the tip ends of the lift pins get in contact with the bottom surface of the substrate placed on the substrate placement surface is detected, and the height positions of the lift pins are adjusted using the height position. However, in the technique disclosed in Japanese Patent Application Publication No. 2017-50534, the contact positions between the lift pins and the substrate are displaced due to the method of setting a threshold value, the strength of the attractive force of the substrate by the electrostatic chuck, and the like, and, thus, sufficient accuracy in detecting the contact positions of the lift pins may not be achieved.

Therefore, in the present embodiment, the contact positions (Contact) of the lift pins are detected using the torque waveforms indicating the temporal changes of the torque of the motor 55 while moving the tip ends of the lift pins 51 from the lower end position (Lower) to the upper end position (Upper) during the chucking of the substrate W. Specifically, the substrate W is chucked while varying a voltage applied to the electrodes 46a of the electrostatic chuck 46, and a torque waveform is obtained for each voltage. The contact positions (Contact) are calculated (detected) from the waveforms.

Figure 5:
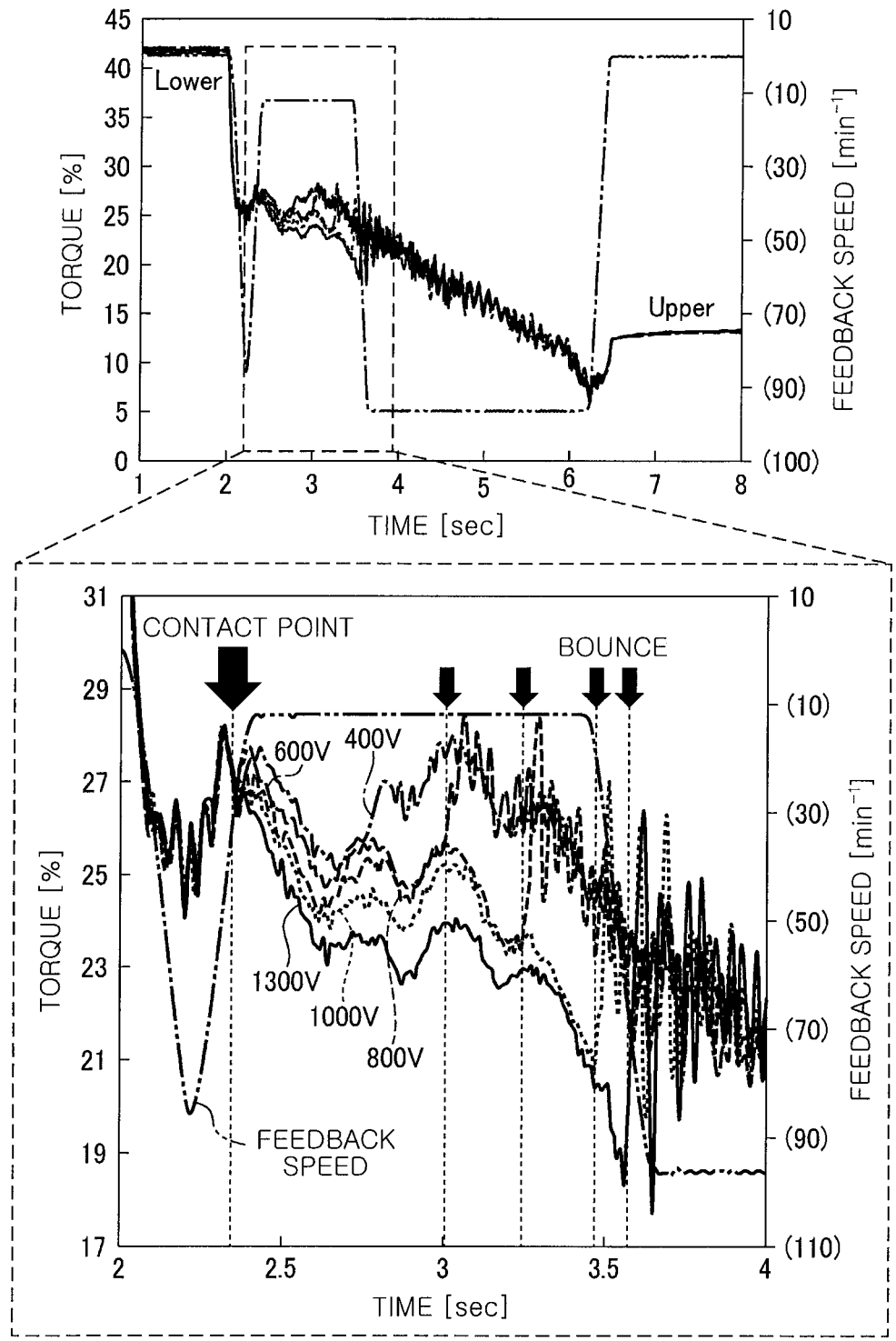
FIG. 5 shows superimposed torque waveforms of a motor when a substrate is chucked while varying a voltage applied to an electrode of an electrostatic chuck in the substrate placement mechanism, wherein the upper part is a general view and the lower part is an enlarged view showing a vicinity of a region where the tip ends of the lift pins get in contact with the substrate.

FIG. 5 shows superimposed torque waveforms of the motor 55 at the time of chucking the substrate W while varying a voltage applied to the electrodes 46a of the electrostatic chuck 46 in the substrate placement mechanism 60, wherein the upper part is a general view and the lower part is an enlarged view showing a vicinity of a region where the tip ends of the lift pins get in contact with the substrate. In this specification, the torque waveforms obtained when the substrate W is placed on the substrate placement table 40 and voltages of 400V, 600V, 800V, 1000V, and 1300V are applied to the electrode 46a of the electrostatic chuck 46 are shown. FIG. 5 also shows the feedback speed of the motor 55.

As shown in the upper part of FIG. 5, the torque values generally decrease as the tip ends of the lift pins 51 are moved from the lower end position (Lower) to the upper end position (Upper) due to the spring force of the bellows 57. Then, as shown in the lower part of FIG. 5, the torque waveforms are substantially the same for all the voltages until a certain point in time, but the torque waveforms are branched depending on the voltage from the timing (contact point) at which the lift pins 51 get in contact with the substrate W. Further, the torque waveforms show fluctuations corresponding to the visible bounce of the substrate W. From this, it is clear that the charging voltage (chuck voltage) at the time of abnormal charging in the actual machine can be monitored by the voltages applied to the electrode 46a.

Figure 6A:
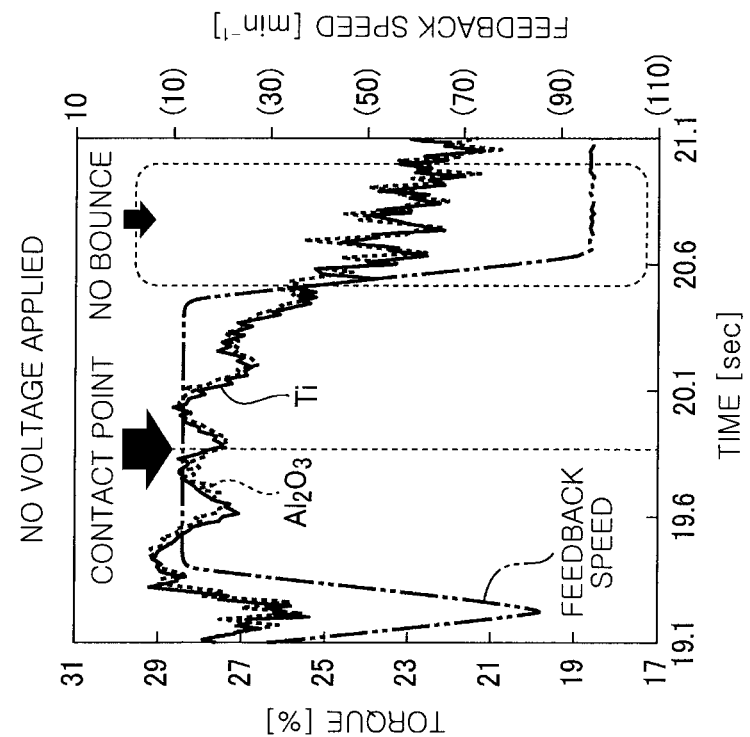
Figure 6B:
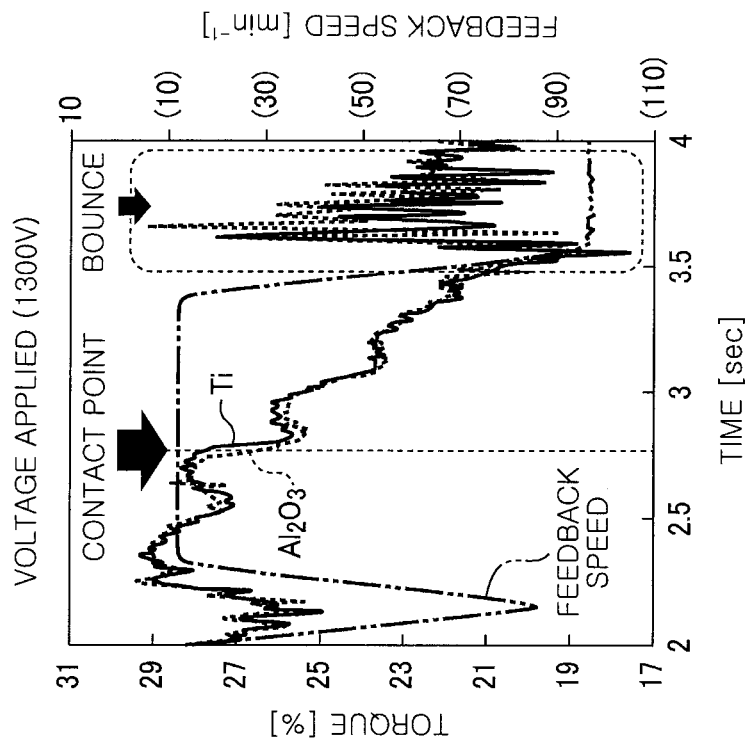

FIGS. 6A and 6B show the torque waveform of the motor 55 in the case where the lift pins 51 are made of Ti and $Al_2O_3$. FIG. 6A shows a case where a voltage of 1300 V is applied to chuck the substrate W, and FIG. 6B shows a case where no voltage is applied. As shown in FIGS. 6A and 6B, when the voltage is applied (see FIG. 6A), both in the case where the lift pins 51 are made of Ti and in the case where the lift pins 51 are made of $Al_2O_3$, the torque decreases considerably at the contact point and keeps decreasing, but the torque varies considerably at a certain timing. Similarly, when no voltage is applied (see FIG. 6B), no significant decrease in the torque is observed, and no abrupt changes in the torque is observed.

This shows that when a voltage is applied to the electrode 46a, the substrate W is attached to the electrostatic chuck 46 for a while even after the lift pins 51 get in contact with the substrate W. Then, at a certain timing, the chucking of the substrate W is suddenly released and the substrate W bounces. When no voltage is applied, the chucking of the substrate W or the bounce of the substrate W is not observed. In other words, regardless of the material of the lift pins, the chucking force on the substrate W due to the voltage applied to the electrode 46a of the electrostatic chuck 46 causes a large decrease in the torque after the contact point, and the substrate W bounces when the chucking force is released.

Figure 7:
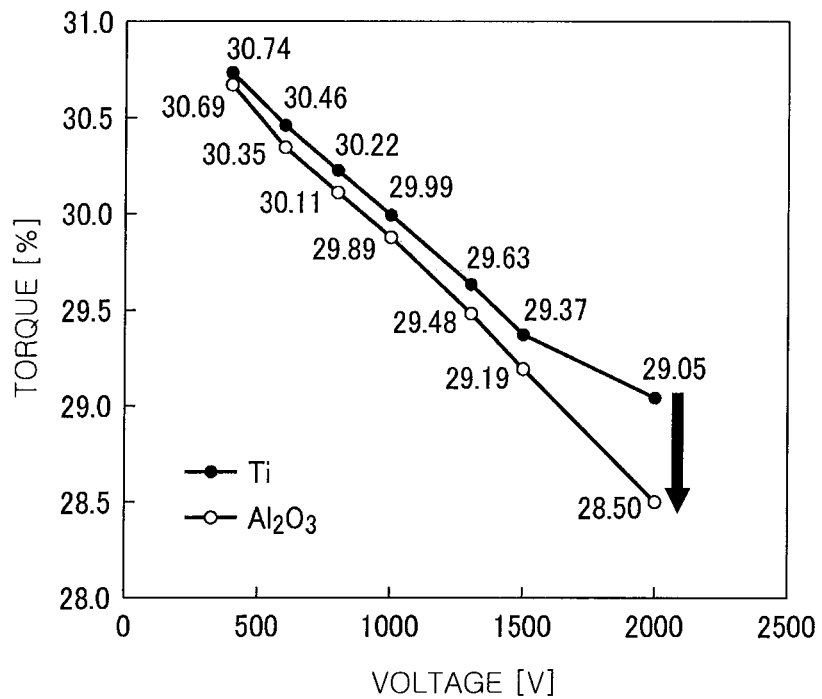
FIG. 7 shows a relationship between a voltage and a torque at a contact point at the time of chucking the substrate while varying a voltage applied to the electrode of the electrostatic chuck in the case where the lift pins are made of Ti and Al2O3.
Figure 8:
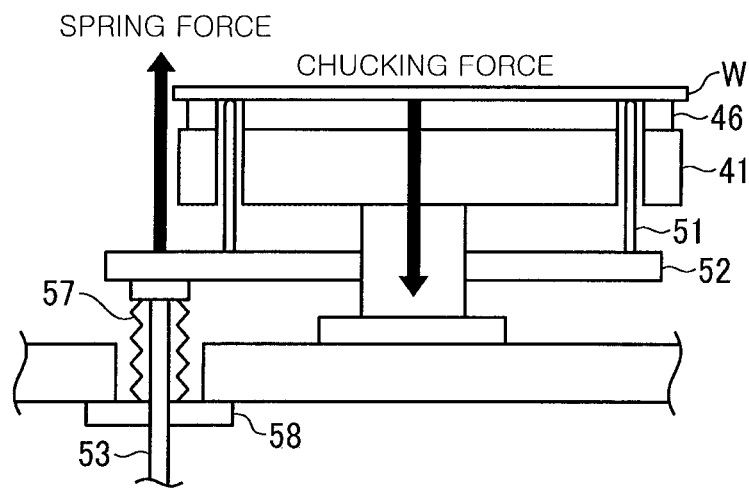
FIG. 8 is a cross-sectional view for explaining a spring force of a bellows and a chucking force of the electrostatic chuck at the contact point of the substrate placement mechanism.

FIG. 7 shows a relationship between a voltage and a torque at the contact point at the time of chucking the substrate W while varying a voltage applied to the electrode 46a of the electrostatic chuck 46 in the case where the lift pins 51 are made of Ti and $Al_2O_3$. As shown in FIG. 7, the torque tends to be decreased as the voltage increases regardless of the material of the lift pins. This is because, as shown in FIG. 8, when the voltage of the electrode 46a, i.e., the charging voltage increases, the chucking force that is a downward force increases compared to the spring force of the bellows 57 that is an upward force. In FIG. 7, the torque is greater when the lift pins 51 are made of Ti than when it is made of $Al_2O_3$, and such tendency is particularly prominent at the maximum voltage of 2000V. This may be because when the lifting pins 51 are made of a conducting material Ti, the neutralizing effect is realized and the chucking force is weakened, so that the pushing-up force is strengthened by the spring force of the bellows 57.

From the above, it is clear that the torque waveforms are branched at the contact point because the applied voltage increases when the lift pins 51 get in contact with the substrate W and the torque of the motor 55 decreases as the chucking force increases. Since the chucking force changes depending on voltages and the torque waveforms are branched at the contact point at which the lift pins 51 get in contact with the substrate W, the contact point can be accurately detected in the actual device.

Then, the contact position of the tip ends of the lift pins 51, which are defined with respect to the lower end position (i.e., the origin), can be detected (calculated) from the contact point and the feedback speed of the motor 55.

Figure 9:
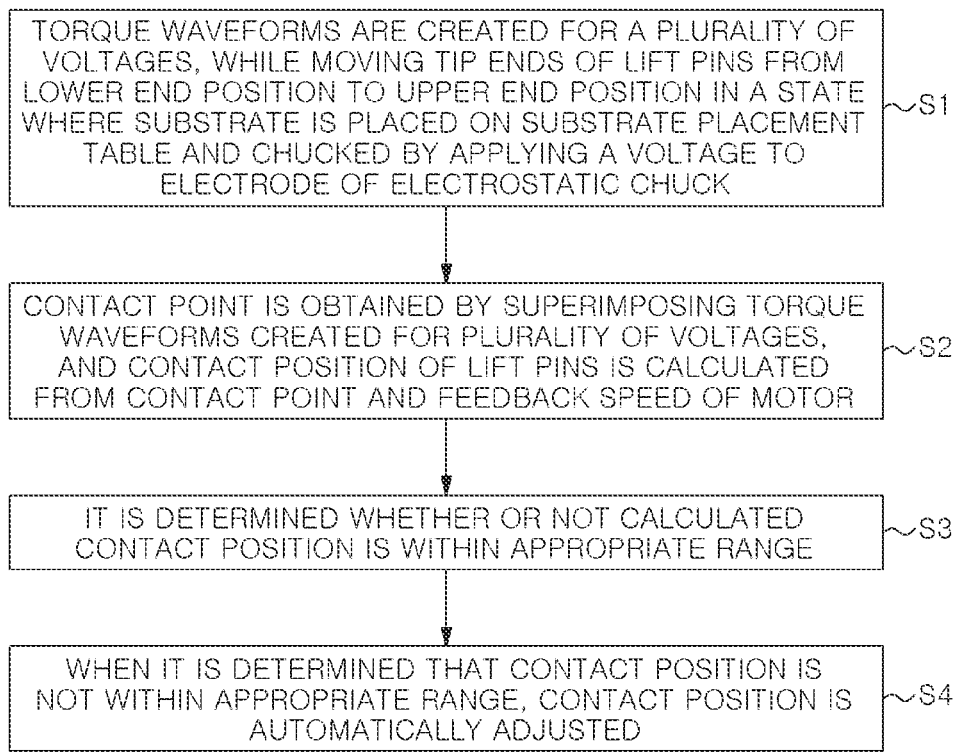
FIG. 9 is a flowchart schematically showing a lift pin contact position adjusting method according to an embodiment.

Next, the steps of the lift pin contact position adjusting method according to the present embodiment will be schematically described. FIG. 9 is a flowchart schematically showing a lift pin contact position adjusting method according to the present embodiment.

As shown in FIG. 9, first, torque waveforms are created for a plurality of voltages, while moving the tip ends of the lift pins from the lower end position to the upper end position in a state where the substrate W is placed on the substrate placement table 40 and chucked by applying a voltage to the electrode 46a of the electrostatic chuck 46 (step S1).

In step S1, the torque waveform creating unit 124 creates a torque waveform, for each of the plurality of voltage, that indicates temporal changes of the torque of the motor 55 while moving the tip ends of the lift pins from the lower end position to the upper end position.

Next, the contact point is obtained by superimposing the torque waveforms created for the plurality of voltages, and the contact position of the lift pins 51 is calculated from the contact point and the feedback speed of the motor 55 (step S2).

In step S2, the contact position calculation unit 125 obtains, as the contact point, a timing at which the torque waveforms are branched in the diagrams shown in FIG. 5 in which the torque waveforms created for the voltages are superimposed, and calculates the contact position from the contact point and the feedback speed of the motor 55 related to the positions of the lift pins 51.

Next, the determination unit 126 determines whether or not the calculated contact position is within an appropriate range (step S3).

Next, when it is determined that the contact position is not within the appropriate range, the contact position is automatically adjusted (step 4). The contact position is automatically adjusted by controlling the driving mechanism 54 in response to a command from the contact position adjusting unit 127 to adjust the lower end position of the tip ends of the lift pins 51.

By executing steps S1 to S4, the contact positions of the lift pins 51 can be automatically adjusted with high accuracy, and it is possible to effectively prevent the substrate from being cracked, displaced, or bounced even when the thermal expansion of the lift pins 51 is large in the processing under extremely low-temperature or high-temperature. Further, since the contact position can be automatically adjusted with high accuracy, the differences between devices can be reduced.

Figure 10:
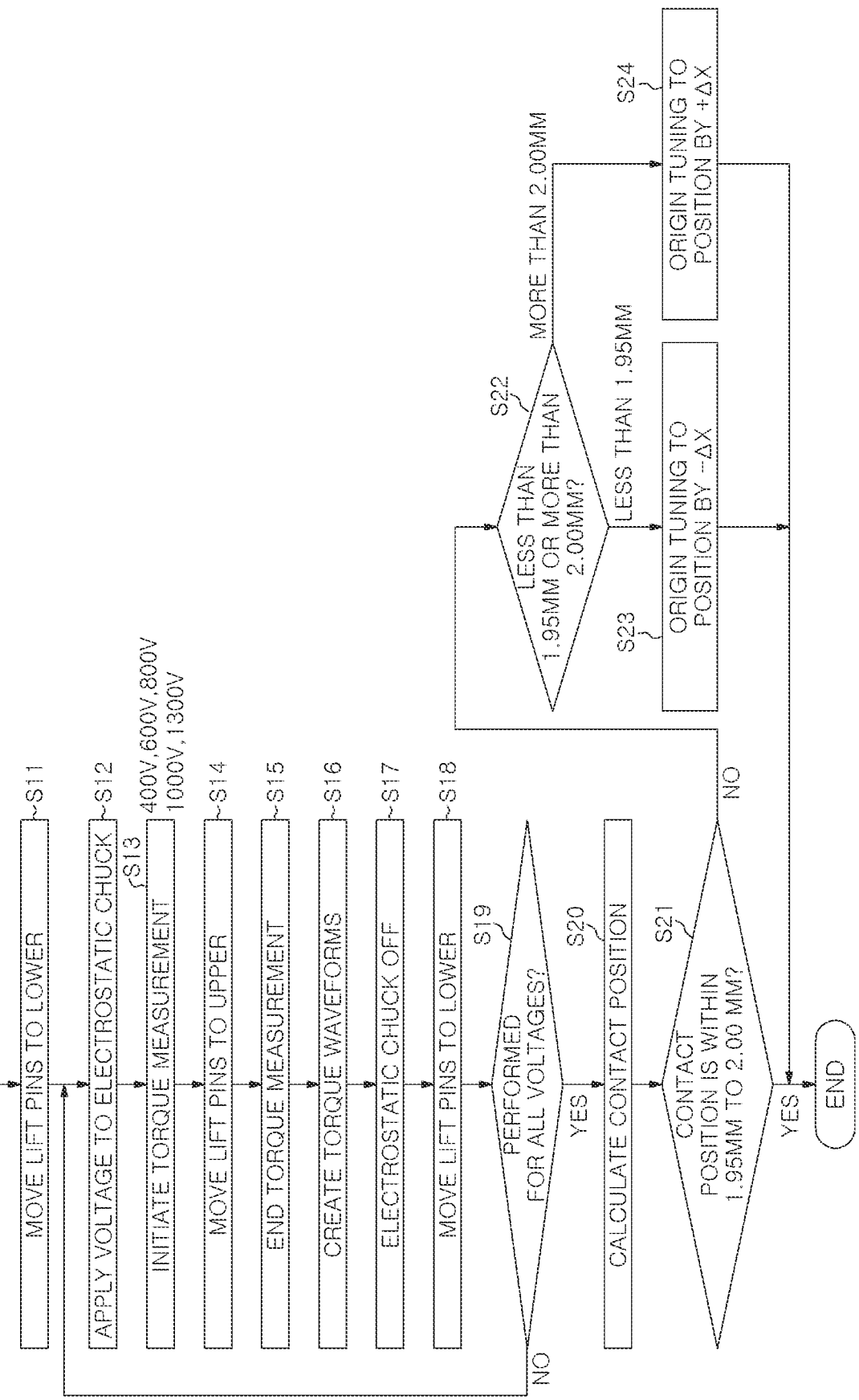
FIG. 10 is a detailed flowchart of the lift pin contact position adjusting method according to the embodiment.

Next, the lift pin contact position adjusting method according to the present embodiment will be described in detail. FIG. 10 is a specific flowchart showing the lift pin contact position adjusting method according to the present embodiment.

First, the tip ends of the lift pins 51 are located at the lower end position (Lower) (step S11), and a voltage is applied to the electrode 46a of the electrostatic chuck 46 (step S12). Accordingly, the substrate W is attracted (chucked). At this time, one of the set voltages is applied. In this example, the voltages of 400V, 600V, 800V, 1000V and 1300V are set, and 400V is applied first. The voltage is not limited thereto. The number of set voltages is not limited, but is preferably three or more.

Next, the measurement of the torque of the motor 55 is started (step S13), and the tip ends of the lift pins 51 are raised to the upper end position (Upper) (step S14). Then, the torque measurement is completed (step S15), and the torque waveform is created (step S16). Then, the voltage of the electrostatic chuck 46 is turned off (step S17). The torque waveform is created by the torque waveform creating unit 124 of the controller 70.

The tip ends of the lift pins 51 are returned to the lower end position (Lower) (step S18). Then, another voltage is applied to the electrode 46a of the electrostatic chuck 46, and the torque measurement and the torque waveform creation are implemented in the same manner (steps S13 to S18). The above-described operations are performed for all the set voltages (step S19). The above series of operations corresponds to step S1 in FIG. 9.

Figure 11:
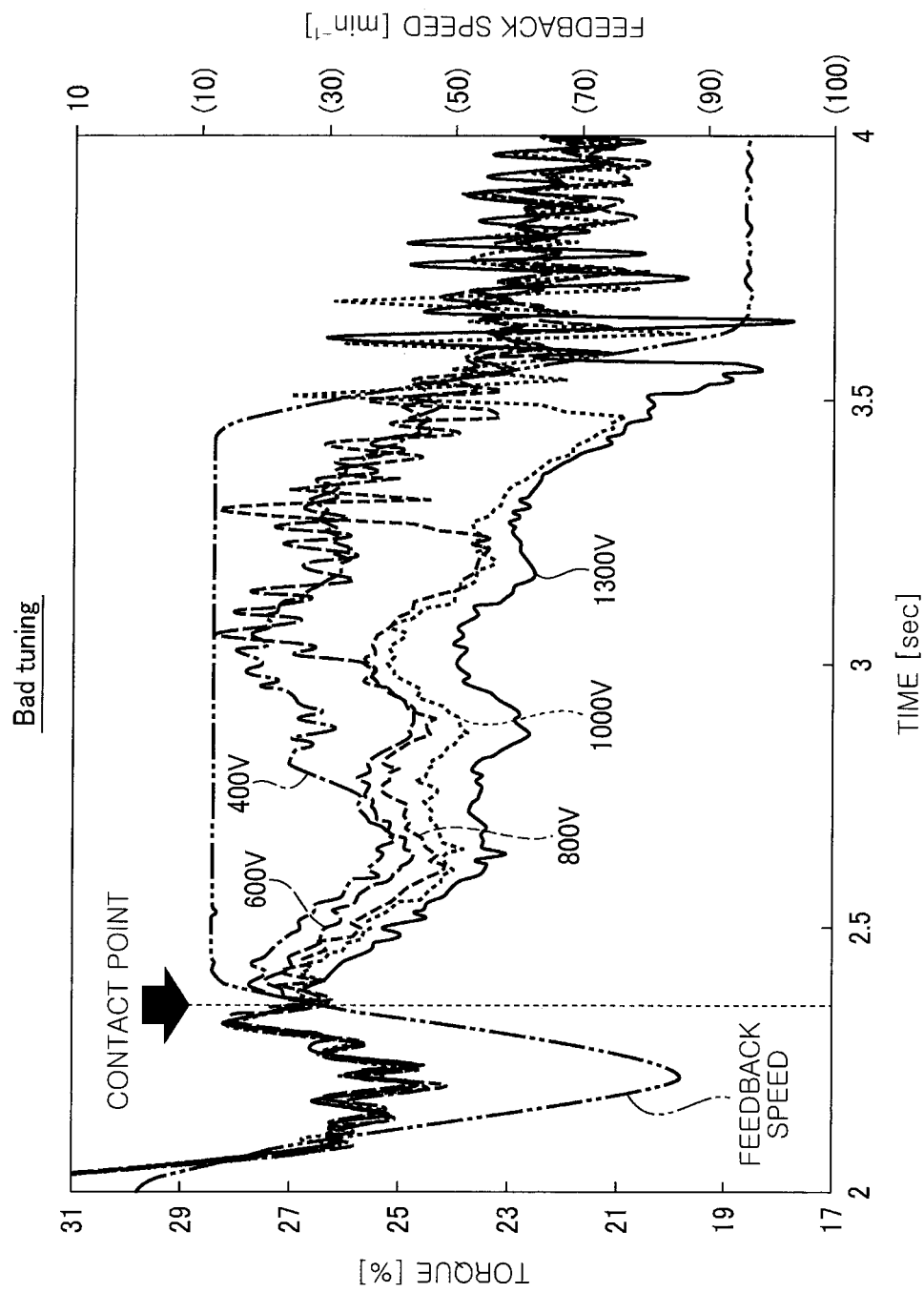
FIG. 11 shows an example in which a contact point is obtained by superimposing torque waveforms created for a plurality of voltages, and shows an example of bad tuning.
Figure 12:
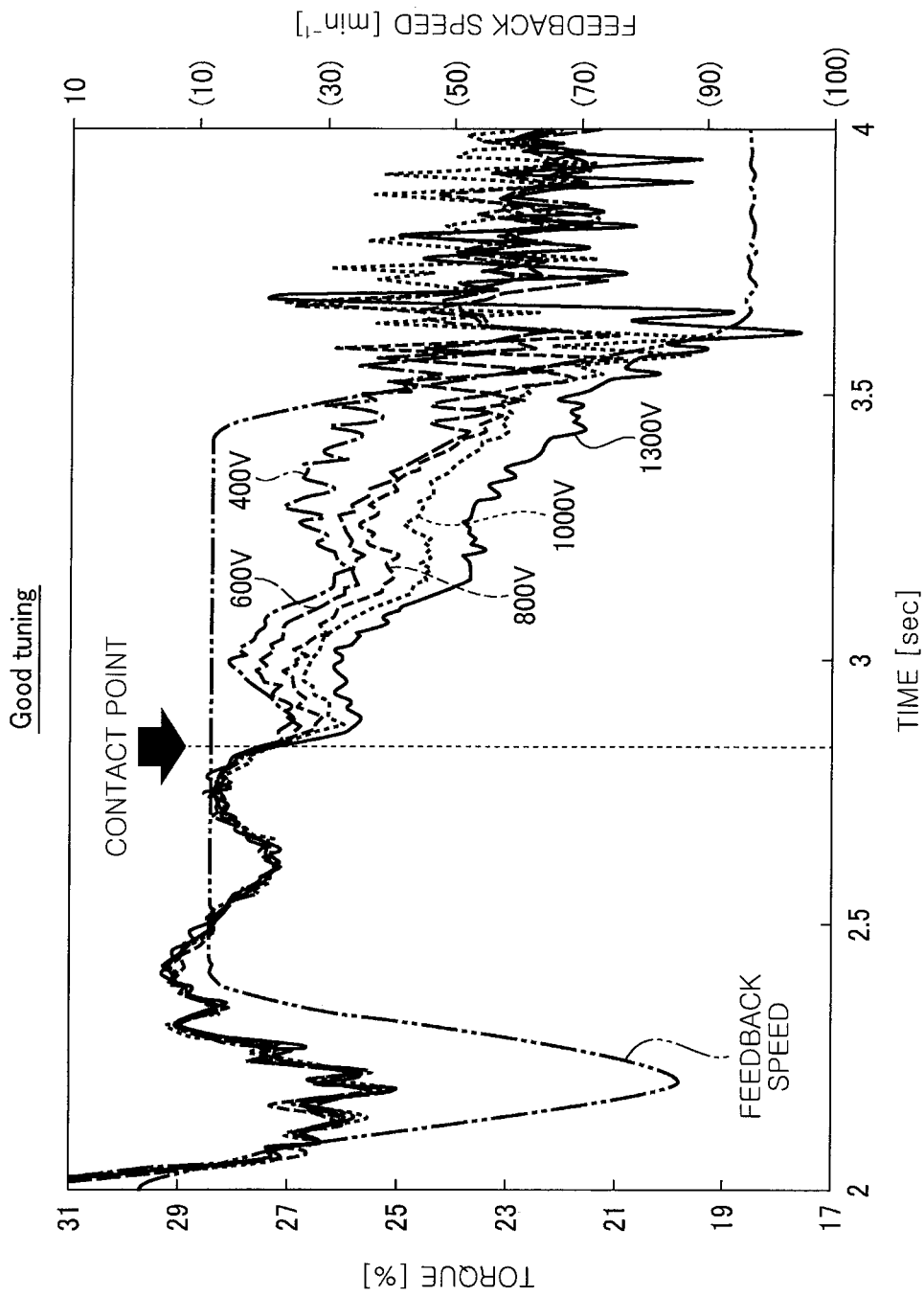
FIG. 12 shows an example in which a contact point is obtained by superimposing torque waveforms created for a plurality of voltages, and shows an example of good tuning.

Next, the contact position is calculated from the torque waveforms created for respective voltages (step S20). Step S20 corresponds to step S2 in FIG. 9. In this specification, first, as described above, the contact point is obtained by superimposing the torque waveforms created for a plurality of voltages. FIGS. 11 and 12 show examples in which the contact point is obtained by superimposing the torque waveforms created for the plurality of voltages. In the example of FIG. 11, the lift pins 51 get in contact with the substrate W before the speed of the motor 55 is decelerated, which is an example of bad tuning. On the other hand, in the example of FIG. 12, the lift pins 51 get in contact with the substrate after the speed of the motor 55 is decelerated, which is an example of good tuning.

Figure 13:
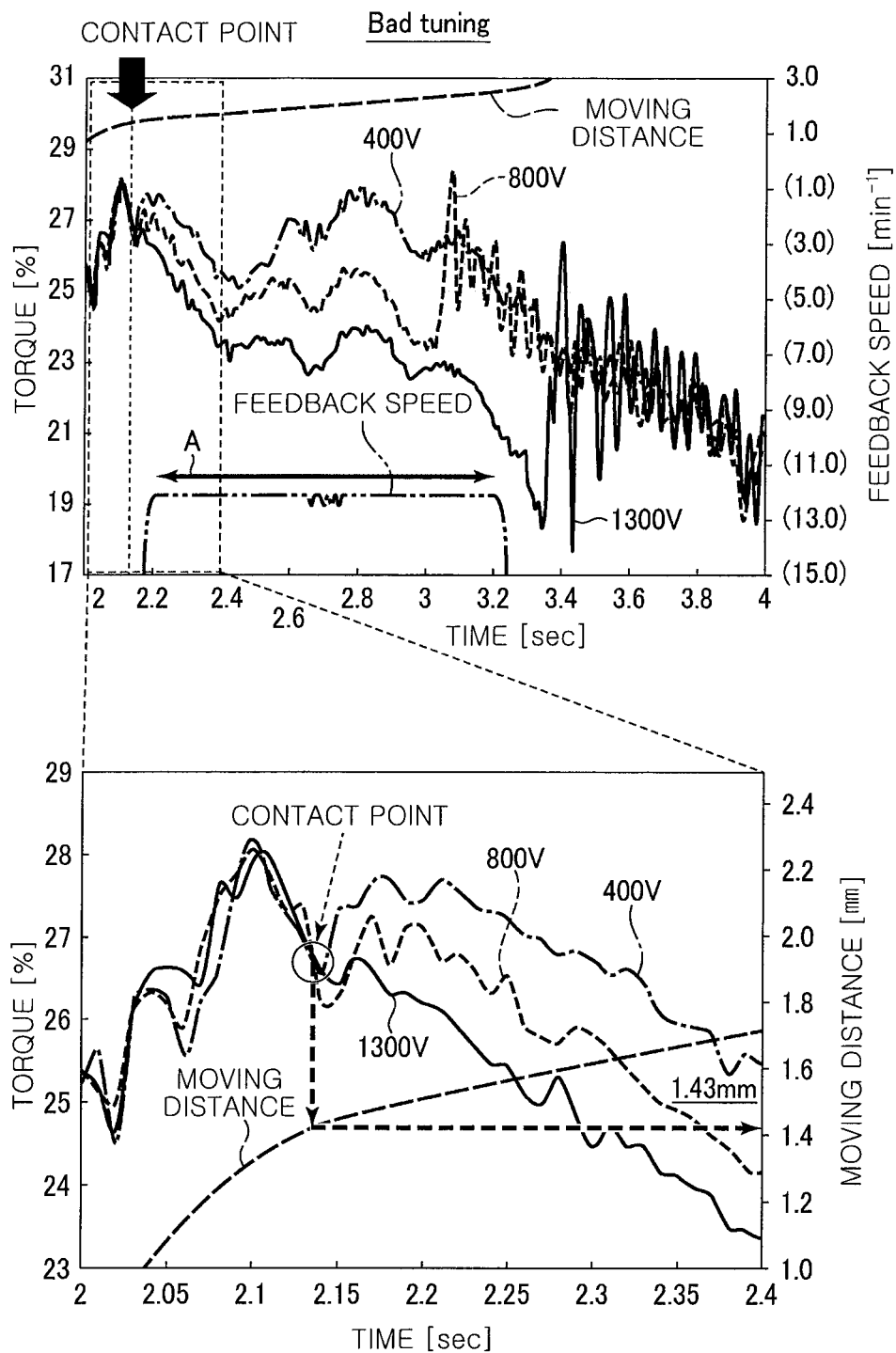
FIG. 13 explains a contact position calculation method in the case of FIG. 11.
Figure 14:
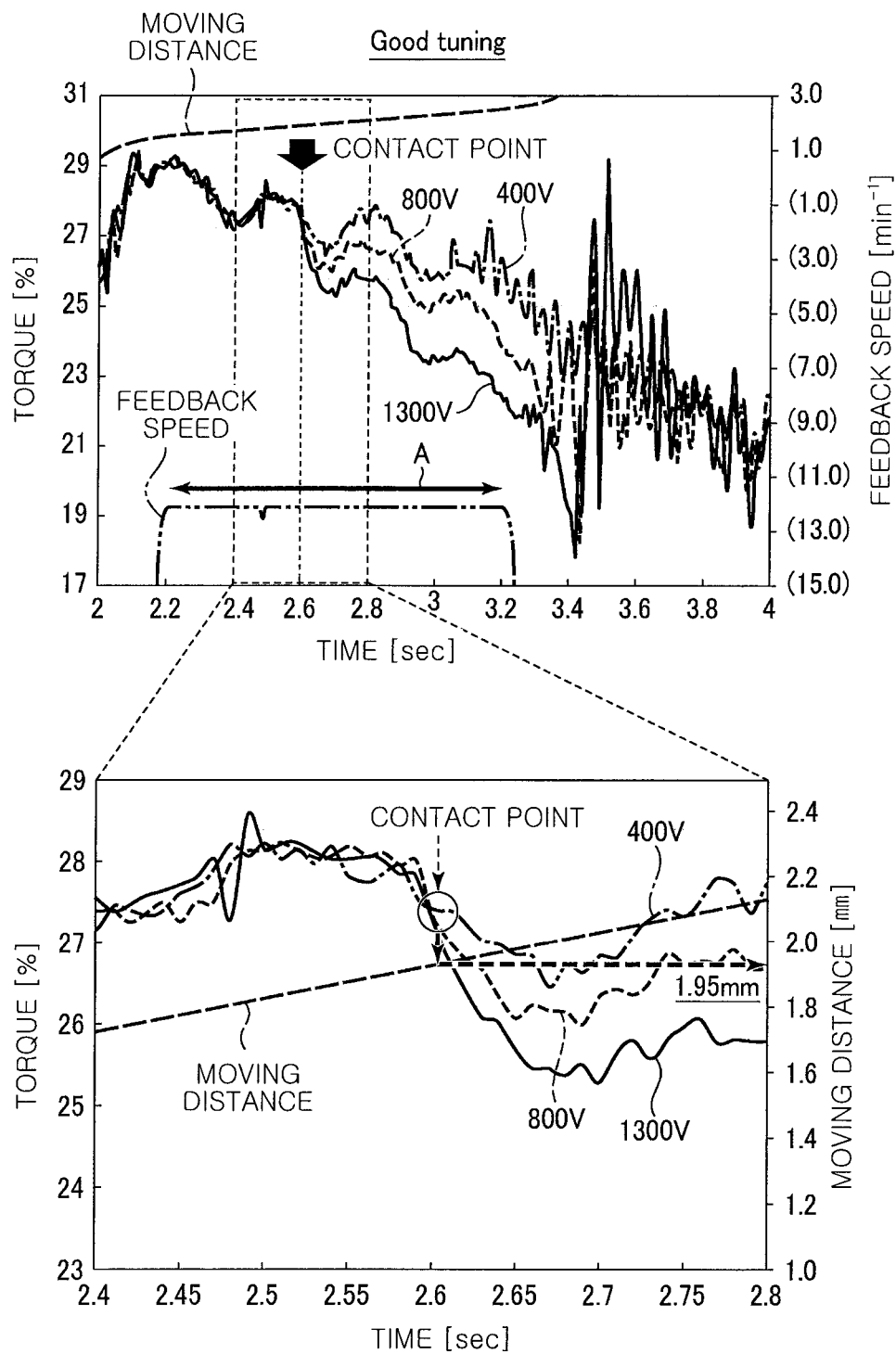
FIG. 14 explains a contact position calculation method in the case of FIG. 12.

As described above, the contact point is obtained and, then, the contact positions are calculated from the contact point and the feedback speed of the motor 55. Such a calculation method will be described in detail in FIGS. 13 and 14 corresponding to FIGS. 11 and 12, respectively. In FIGS. 13 and 14, for convenience, only torque waveforms of the voltages of 400V, 800V, and 1300V are illustrated.

The upper part of FIG. 13 shows superimposed torque waveforms similarly to FIG. 11. The lower part of FIG. 13 shows an enlarged view thereof and also shows the moving distance of the lift pins 51 from the origin, which is obtained from the feedback speed of the motor 55. As shown in the lower part of FIG. 13, at the contact point, the moving distance is 1.43 mm which shows that the contact position is 1.43 mm.

The upper part of FIG. 14 shows superimposed torque waveforms similarly to FIG. 12. The lower part of FIG. 14 shows an enlarged view thereof and also shows the moving distance of the lift pins 51 from the origin, which is obtained from the feedback speed of the motor 55. As shown in the lower part of FIG. 14, at the contact point, the moving distance is 1.95 mm which shows that the contact position is 1.95 mm.

Next, it is determined whether or not the contact position is within the range of 1.95 mm to 2.00 mm (step S21). As described above, it is desirable that the lift pins 51 get in contact with the substrate W in the region where the motor of the lift pins 51 is decelerating as indicated by arrows A of the upper parts of FIGS. 13 and 14. In this specification, an example in which the contact position is set to be within the range of 1.95 mm to 2.00 mm such that the contact point falls within a specific range in the region A is described. However, the contact position is not limited to such a range.

If the contact position is within the range of 1.95 mm to 2.00 mm in step S21, the adjustment is not required, so the processing is ended. In the tuning of FIG. 14, the contact position is 1.95 mm and, thus, the processing is ended.

When the contact position is not within the range of 1.95 mm to 2.00 mm, it is determined whether it is less than 1.95 mm or exceeds 2.00 mm (step S22). If it is less than 1.95 mm, the origin tuning is performed by moving the origin to a position farther by ΔX (the shortfall amount) (step S23). In other words, the origin is shifted downward by ΔX so that the contact position becomes longer from the origin by ΔX. When the contact position in FIG. 13 is 1.43 mm, ΔX is set to 0.57 mm, and the origin tuning is performed such that the contact position is separated from the origin by 2.00 mm. On the other hand, if it exceeds 2.00 mm, the origin tuning is performed by moving the origin to a position closer by ΔX (the excess amount) (step S24). In other words, the origin is shifted upward by ΔX such that the contact position becomes shorter from the origin by ΔX.

As described above, the contact position of the lift pins 51 can be automatically adjusted with high accuracy.

<Other Applications>

The embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

For example, in the above-described embodiment, the sputtering film formation has been described as an example of the substrate processing. However, the present disclosure is not limited thereto, and other processing such as CVD film formation, etching, and the like may be performed.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for adjusting a contact position of lift pins in a substrate placement mechanism, wherein the substrate placement mechanism includes: a substrate placement table having a substrate placed thereon and having an electrostatic chuck configured to electrostatically attract a substrate; and a substrate lifting mechanism including lift pins protrudable beyond and retractable below a substrate placement surface of the substrate placement table and a driving mechanism having a motor configured to raise and lower the lift pins, and wherein the contact position of the lift pins is a height position at which tip ends of the lift pins get in contact with the substrate, the method comprising:
    creating a plurality of torque waveforms, for a plurality of voltages for applying to an electrode of the electrostatic chuck, each of the plurality of torque waveforms indicating temporal changes of a torque of the motor while moving the tip ends of the lift pins from a lower end position below the substrate placement surface and an upper end position above the substrate placement surface in a state where the substrate is placed on the substrate placement table and chucked by application of the respective voltage to the electrode of the electrostatic chuck;
    obtaining from the plurality of torque waveforms a contact point that is a timing at which the lift pins get in contact with the substrate and calculating the contact position from the contact point and a speed of the motor;
    determining whether or not the contact position is within an appropriate range; and
    automatically adjusting the contact position responsive to determining that the contact position is not within the appropriate range.

2. The method for adjusting a contact position of lift pins of claim 1, wherein the substrate placement mechanism includes a spring member that applies an upward spring force on the lift pins.

3. The method for adjusting a contact position of lift pins of claim 1, wherein in said calculating the contact position, the contact point is obtained by superimposing the plurality of torque waveforms created for the plurality of voltages.

4. The method for adjusting a contact position of lift pins of claim 3, wherein the contact point is a timing at which the plurality of torque waveforms respectively corresponding to the plurality of voltages diverge from each other.

5. The method for adjusting a contact position of lift pins of claim 1, wherein the contact position is defined as a height position by using the lower end position as an origin, and the contact position is automatically adjusted by controlling the driving mechanism to adjust the lower end position.

6. A method for detecting a contact position of lift pins in a substrate placement mechanism, wherein the substrate placement mechanism includes: a substrate placement table having a substrate placed thereon and having an electrostatic chuck configured to electrostatically attract a substrate; and a substrate lifting mechanism including lift pins protrudable beyond and retractable below a substrate placement surface of the substrate placement table and a driving mechanism having a motor configured to raise and lower the lift pins, and wherein the contact position of the lift pins is a height position at which tip ends of the lift pins get in contact with the substrate, the method comprising:
    creating a plurality of torque waveforms, for a plurality of voltages for applying to an electrode of the electrostatic chuck, each of the plurality of torque waveforms indicating temporal changes of a torque of the motor while moving the tip ends of the lift pins from a lower end position below the substrate placement surface and an upper end position above the substrate placement surface in a state where the substrate is placed on the substrate placement table and chucked by application of the respective voltage to the electrode of the electrostatic chuck; and
    obtaining from the plurality of torque waveforms a contact point that is a timing at which the lift pins get in contact with the substrate and calculating the contact position from the contact point and a speed of the motor.

7. The method for detecting a contact position of lift pins of claim 6, wherein the substrate placement mechanism includes a spring member that applies an upward spring force on the lift pins.

8. The method for detecting a contact position of lift pins of claim 6, wherein in said calculating the contact position, the contact point is obtained by superimposing the plurality of torque waveforms created for the plurality of voltages.

9. The method for detecting a contact position of lift of claim 8, wherein the contact point is a timing at which the plurality of torque waveforms respectively corresponding to the plurality of voltages diverge from each other.

10. A substrate placement mechanism for placing thereon a substrate in a processing chamber of a substrate processing apparatus for processing a substrate, comprising:
    a substrate placement table having the substrate placed thereon and having an electrostatic chuck configured to electrostatically attract the substrate;

a substrate lifting mechanism including lift pins protrudable beyond and retractable below a substrate placement surface of the substrate placement table and a motor configured to raise and lower the lift pins; and a controller, wherein the controller includes:

a torque waveform creating unit configured to create a plurality of torque waveforms, for a plurality of voltages for applying to an electrode of the electrostatic chuck, each of the plurality of torque waveforms indicating temporal changes of a torque of the motor while moving tip ends of the lift pins from a lower end position below the substrate placement surface and an upper end position above the substrate placement surface in a state where the substrate is placed on the substrate placement table and chucked by application of the respective voltage to the electrode of the electrostatic chuck;

a contact position calculation unit configured to obtain from the plurality of torque waveforms a contact point that is a timing at which the lift pins get in contact with the substrate and calculating the contact position from the contact point and a speed of the motor;

a determination unit configured to determine whether or not the contact position is within an appropriate range; and a contact position adjusting unit configured to automatically adjust the contact position responsive to determining that the contact position is not within the appropriate range.

11. The substrate placement mechanism of claim 10, further comprising:

a spring member that applies an upward spring force on the lift pins.

12. The substrate placement mechanism of claim 10, wherein when the contact position is calculated, the contact position calculation unit obtains the contact point by superimposing the plurality of torque waveforms created for the plurality of voltages.

13. The substrate placement mechanism of claim 12, wherein the contact position calculation unit obtains, as the contact point, a timing at which the plurality of torque waveforms respectively corresponding to the plurality of voltages diverge from each other.

14. The substrate placement mechanism of claim 10, wherein the contact position is defined as a height position by using the lower end position as the origin, and the contact position adjusting unit controls the driving mechanism to adjust the lower end position.

15. The substrate placement apparatus of claim 10, wherein the substrate processing apparatus is a sputtering apparatus that deposits sputter particles from a target on the substrate to form a film.

* * * * *